(12) United States Patent
Walden

(10) Patent No.: US 6,614,294 B1
(45) Date of Patent: Sep. 2, 2003

(54) FILTER TO REMOVE NOISE COUPLING INTO A SENSITIVE CIRCUIT NODE

(75) Inventor: Robert William Walden, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/320,275

(22) Filed: May 28, 1999

(51) Int. Cl.[7] ................................................. H03K 5/00
(52) U.S. Cl. ........................ 327/558; 327/552; 327/311
(58) Field of Search ................................. 327/552, 558, 327/311, 551

(56) References Cited

U.S. PATENT DOCUMENTS 5,559,474 A * 9/1996 Matsumoto et al. .......... 331/17
6,072,360 A * 6/2000 McCullough ................ 327/552

* cited by examiner

Primary Examiner—Dinh T. Le
(74) Attorney, Agent, or Firm—Steve Mendelsohn

(57) ABSTRACT

A recurring noise filter for removing from a signal noise generated by parasitic coupling from a switching network. The filter contains an input filter, a sampling switch and an output filter. The input filter is a low pass filter which receives a signal containing noise generated by parasitic coupling from a switching network. The sampling switch is connected between the low pass filter and an output filter, with the sampling switch activating in response to the recurring switching of said switching network to sample the signal during the interval at which said noise does not occur within the signal. The output filter removes signals generated by the sampling switch from the sampled signal thereby generating a noise-filtered signal.

21 Claims, 4 Drawing Sheets

FIG. 2A — PERIODIC SIGNAL
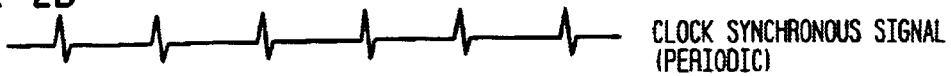
FIG. 2B — CLOCK SYNCHRONOUS SIGNAL (PERIODIC)
FIG. 2C — CLOCK SYNCHRONOUS SIGNAL (APERIODIC)
FIG. 2D — CLOCK
FIG. 2E — DESIRED ANALOG SIGNAL
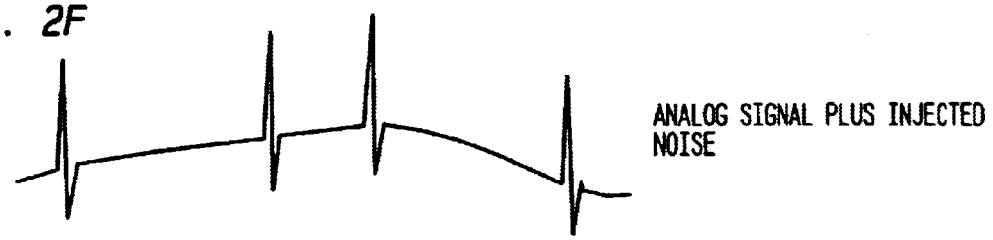
FIG. 2F — ANALOG SIGNAL PLUS INJECTED NOISE
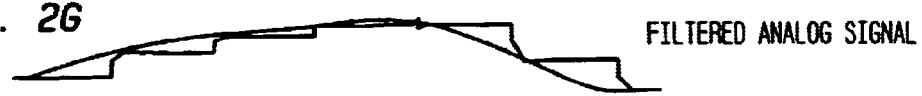
FIG. 2G — FILTERED ANALOG SIGNAL

US 6,614,294 B1

FILTER TO REMOVE NOISE COUPLING INTO A SENSITIVE CIRCUIT NODE

BACKGROUND

1. Field of the Invention

The present invention relates generally to reducing switching noise generated by the coupling between adjacent nodes or pins of, for example, an integrated circuit.

2. Description of the Prior Art

As power supply voltage levels continue to drop for integrated circuit products, it becomes more difficult to obtain adequate signal-to-noise ratios for high performance analog circuits. Simultaneously, as integrated circuits are being reduced in size, they require a greater number of input and output pins which results in the pins being located physically closer together. The problem with locating pins physically closer is the consequent increase in inductive and capacitive coupling between adjacent circuit pins. This coupling problem is especially acute in situations where a large number of switching operations take place at one of the nodes, for instance, when the node is utilized for periodic, or non-periodic but clock-synchronous pulses. Such a situation arises when a digital pin, or an analog pin with a large voltage swing, is located adjacent to a circuit pin that is noise sensitive, such as when the adjacent circuit pin is required to maintain a reference voltage or reference current level.

The traditional approach to the problem of cross-coupling was to design the circuit package so as to isolate sensitive pins from those pins that generate excessive cross-coupling. The drawback to this approach is the extensive design effort required to isolate the sensitive pins, which may not even be possible, or the requirement of major changes to existing circuit designs.

SUMMARY OF THE INVENTION

In view of the shortcomings in conventional approaches for reducing cross coupling between adjacent pins in integrated circuits, it is an object of the present invention to provide a technique for filtering signals that change slowly compared to the frequency of the signal generating parasitic noise.

It is another object of the present invention to provide a switched capacitor circuit to sample a signal containing recurring noise generated by parasitic coupling from an adjacent switching network at the rate of the switching network so as to sample the signal during times when the signal is not affected by the parasitic coupling.

In accordance with the above objects and additional objects that will become apparent hereinafter, embodiments of the present invention filter a signal subject to parasitic coupling by an adjacent switching network, such as a clock signal or other recurring signal, by passing the signal subject to the coupling through a low pass filter, activating a switch to sample and hold the low pass filtered signal during times that the signal is not affected by the parasitic coupling, and then filtering the sampled signal so as to reduce noise generated by the sampling switch. The sampling switch is activated periodically by the device that is generating the parasitic coupling, such as a clock signal, so that, after a suitable delay or other timing mechanism, the signal is sampled and held at the value that occurs when the signal is not affected by the parasitic coupling. In one embodiment, a switched-capacitor circuit is used to filter out undesired periodic or clock-synchronous noise that is coupled from a switching node to an adjacent noise-sensitive circuit node. Such an embodiment is appropriate for use in applications where a sensitive DC input or slowly changing AC input is constrained to be placed adjacent to a clock-synchronous signal.

BRIEF DESCRIPTION OF THE DRAWINGS

FIG. 2 are illustrative examples of waveforms;

DETAILED DESCRIPTION OF THE PREFERRED EMBODIMENT

The present invention provides a novel technique for isolating sensitive pins in an integrated circuit from those pins that generate excessive cross-coupling by using conventional resistor-capacitor ("R-C") and switched-capacitor circuits that are well known in the art. The switched-capacitor circuit filters periodic, or non-periodic but clock-synchronous, noise that is coupled from a switching node to an adjacent sensitive circuit node by sampling and holding the sensitive circuit node signal at the periodic or non-periodic clock synchronous signal rate.

Figure 1:
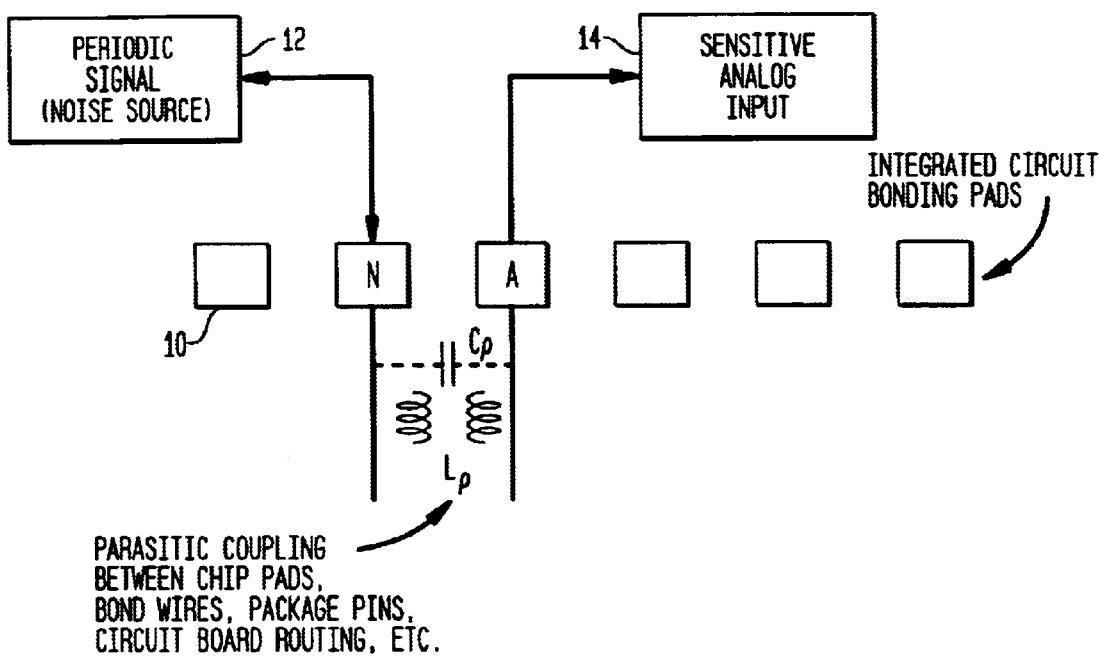
FIG. 1 is a schematic of the noise coupling from a periodic signal node to a sensitive input node.

FIG. 1 illustrates schematically the inductive and capacitive coupling between two adjacent circuit pins. In general, inductive and capacitive parasitic coupling occurs from the chip bonding pads, bond wires, package pins and from the routing traces in the circuit board on which the chip is mounted. These parasitic couplings are illustrated in FIG. 1 as parasitic inductance Lp and parasitic capacitance Cp between adjacent integrated circuit bonding pads 10, specifically bonding pads N and A. Bonding pad N is illustrated as being connected to a noise source 12 and bonding pad A is shown as being connected to a sensitive analog input 14.

The noise source connected to bonding pad N can be any recurring signal. The noise source can be periodic, periodic clock synchronous, aperiodic clock synchronous, or a clock signal. Examples of such signals are illustrated in FIGS. 2a through 2d. An example of a noise-sensitive signal is shown in FIG. 2e. When a potential noise source is connected adjacent to a noise-sensitive signal, as shown by bonding pads N and A of FIG. 1, the noise source 12 can inject spurious signals through cross-coupling into the noise-sensitive signal. In some instances, a coupling capacitance as small as 1 pF from a switching signal into an adjacent analog node can cause severe noise problems. An example of such injection of a noise signal is shown by the waveform of FIG. 2f which illustrates the resultant corrupted waveform when the aperiodic clock synchronous signal of FIG. 2c is injected into the desired analog signal of FIG. 2e through capacitive and inductive coupling.

In general, an R-C filter alone could be used to reduce injected noise. However, for low frequency periodic noise, for example, in the range of 50 kHz or less, an integrated circuit implementation of such a filter may be very large in terms of silicon area. This drawback can be eliminated by using a switched capacitor circuit to filter the generated noise out of the signal by momentarily closing a sampling switch on each cycle of the noise-sensitive signal to sample and hold the value of the noise-sensitive signal during the time period that the noise source is not interfering with the noise-sensitive signal.

Figure 3A:
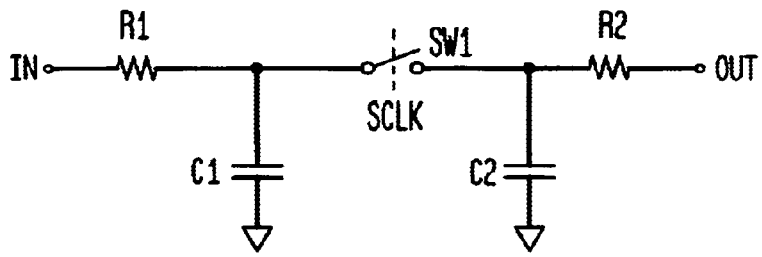
FIGS. 3a and 3b are schematics of the switching filter and sample clock generator.

FIG. 3 shows an implementation of this filter technique. Filter 16 of FIG. 3a includes input filter R1, C1, output filter R2, C2 and sampling switch SW1. The sampling switch may be composed of one or more MOS devices which are turned on momentarily at the frequency of the noise signal. The input and output R-C filters provide some smoothing of high-frequency noise on the input signal and of charge injected by turning on and off the MOS devices which compose sampling switch SW1. The resistors R1 and R2 may be either active devices or any type of standard resistor available in a given integrated circuit technology.

Figure 3B:
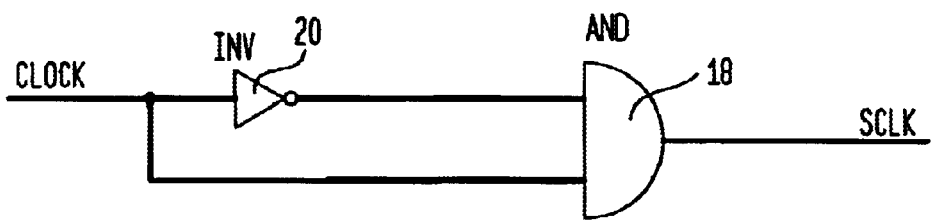
Figure 3C:
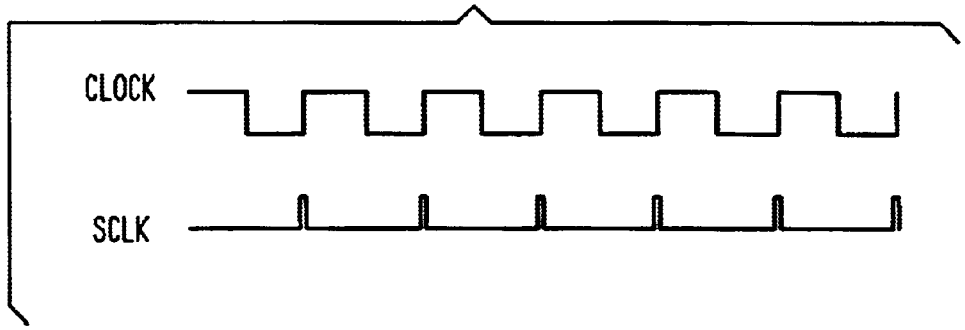
FIG. 3c is a timing diagram for the reference clock and sample clock waveforms.

The circuit of FIG. 3b may be used to generate the clock signal SCLK of FIG. 3a. Generally, the clock signal will be derived from the noise source. As is well-known in the art, at the rising edge of signal CLOCK, both inputs to AND gate 18 are high so that the output signal SCLK goes high. When the rising CLOCK signal has propagated through inverter 20, as a falling input to AND gate 18, the output signal SCLK once again goes low. Thus, the length of time that SCLK pulse remains high depends primarily on the propagation delay time through inverter 20. FIG. 3c shows the relationship between the input CLOCK signal and the output SCLK signal from the circuit of FIG. 3b.

In operation, input filter R1, C1 provides smoothing of high-frequency noise on the input signal of the filter. Next, the signal generating the parasitic noise is used to generate the clock signal as shown in FIG. 3b. For example, the rising edge or the falling edge of the CLOCK signal may be used to momentarily activate sampling switch SW1 which causes the circuit to periodically sample the waveform into which the noise is injected. The analog signal is sampled during the quiet times of the signal. Finally, output filter R2, C2 provides smoothing of the output signal which may be affected by the operation of sampling switch SW1 and holds the sampled value until the next operation of sampling switch SW1.

In the preferred embodiment, sampling switch SW1 closes in response to SCLK being high and opens when SCLK is low. An example of the filtering provided by filter 16 is illustrated by the waveform of FIG. 2g which is the filtered waveform of FIG. 2f sampled at a rate determined by the waveform of FIG. 2b. As apparent, the filtered waveform has small-amplitude discrete steps.

Depending on the sampling phase chosen, the filtered waveform may have a DC offset compared to the desired signal but the waveform will not have the AC component of the noise. If the DC offset is important to the particular application, the sample clock phase may be adjusted, by, for example, a fixed clock delay line or by an actively-tuned delay, to sample at a phase of the injected noise signal at which there is no DC offset. This occurs at the zero-crossings of the injected noise signal.

As apparent, this technique for filtering is applicable for a wide range of clock frequencies, including continually varying clock frequencies, provided only that the signal subject to parasitic noise changes slowly when compared to the frequency of the signal generating the parasitic noise.

Figure 4:
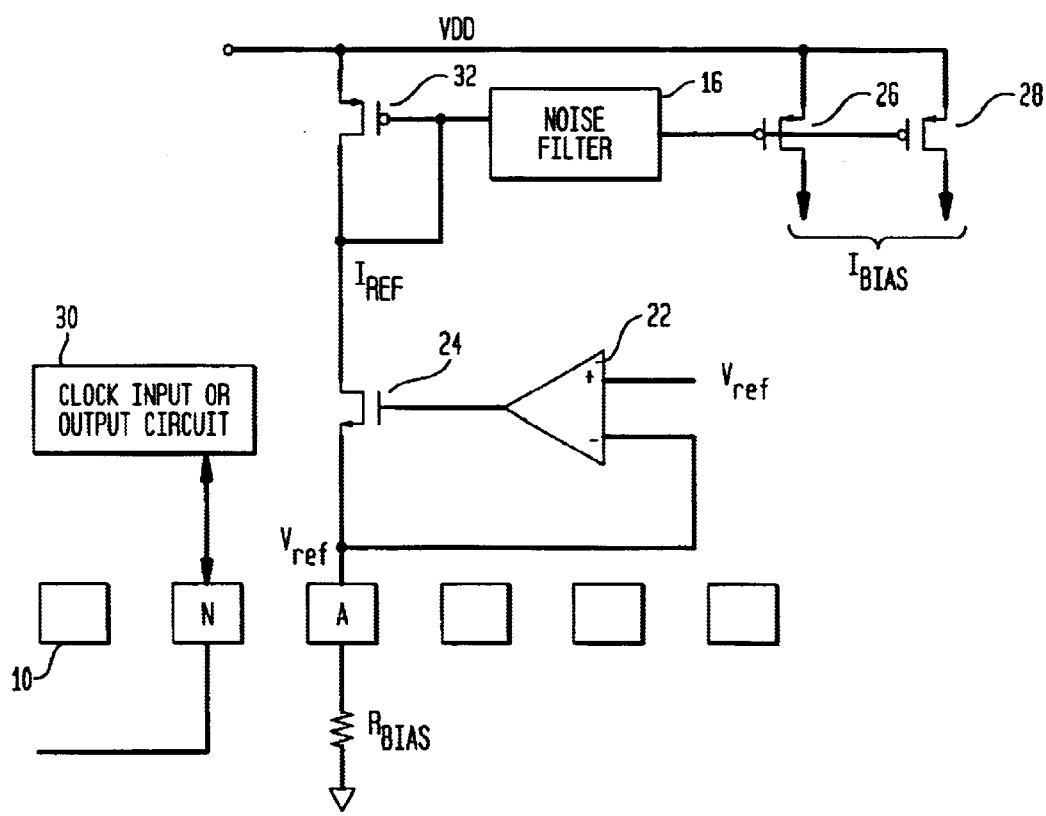
FIG. 4 is a schematic of the noise filter used in a current bias generator circuit.

An example of the use of this filter technique to reduce noise coupling in a current bias circuit is shown in FIG. 4. The clock signal on pad N can range in frequency from 32 kHz to several MHz. This clock signal is buffered, delayed, translated to short pulses, and then used as the clock signal for the noise filter. Adjacent pad A is part of a bias current reference circuit which can be noise sensitive. Operational Amplifier 22 and MOS device 24 maintain constant voltage Vref at node A, which in turn generates a constant current Iref which equals Vref divided by Rbias in the absence of injected noise. The current Iref is in turn mirrored by devices 26 and 28 for other circuits. However, when the noise generated by the signal from clock input or output 30 through node N couples into node A, the injected charge causes variations in Iref and thereby in the mirrored currents which are derived from Iref. In order to reduce the effects of noise in the mirrored currents, noise filter 16 of FIG. 3 is inserted between the gates of devices 32 and 26. Noise filter 16 samples and holds the analog signal Iref at a rate determined by the clock signal on pad N thereby resulting in a filtered signal with discrete steps for use as a current reference in other circuits.

The present invention has been shown in what is considered to be the most practical and preferred embodiment. It is anticipated, however, that departures may be made therefrom and that obvious modifications will occur to persons skilled in the art.

What is claimed is:

1. Apparatus for reducing time-dependent noise coupled into a first signal at a first node from a second signal at a second node, comprising:
 a sample clock generator adapted to generate a sampling clock signal based on the second signal; and
 a filter circuit adapted to (1) receive the sampling clock signal and the first signal and (2) sample the first signal based on the sampling clock signal to generate a filtered version of the first signal, wherein the sampling clock signal causes the filter circuit to sample the first signal at times when the time-dependent noise is relatively low.

2. The invention of claim 1, wherein the filter circuit samples the first signal based on occurrences of pulses in the sampling clock signal.

3. The invention of claim 2, wherein:
 the second signal is a clock synchronous signal; and
 the sample clock generator converts transitions in the second signal into the pulses in the sampling clock signal.

4. The invention of claim 3, wherein the second signal is an aperiodic signal.

5. The invention of claim 1, wherein:
 the filter circuit comprises a switch controlled by the sampling clock signal;
 the sampling clock signal causes the switch to open and close; and
 the filter circuit samples the first signal when the switch is closed.

6. The invention of claim 5, wherein:
 the first circuit further comprises first and second low-pass filters with the switch connected therebetween;
 the first low-pass filter filters the first signal before it is applied to the switch; and
 the second low-pass filter filters the first signal after it passes through the switch when the switch is closed.

7. The invention of claim 6, wherein the second low-pass filter retains a sampled value of the first signal for use outside the apparatus.

8. The invention of claim 1, wherein the first and second ports are pins of a single integrated circuit.

9. The invention of claim 1, wherein:
 the filter circuit samples the first signal based on occurrences of pulses in the sampling clock signal;

the second signal is a clock synchronous signal;

the sample clock generator converts transitions in the second signal into the pulses in the sampling clock signal;

the filter circuit comprises:

a switch controlled by the sampling clock signal, wherein:

the sampling clock signal causes the switch to open and close; and the filter circuit samples the first signal when the switch is closed; and first and second low-pass filters with the switch connected therebetween, wherein:

the first low-pass filter filters the first signal before it is applied to the switch;

the second low-pass filter filters the first signal after it passes through the switch when the switch is closed;

the second low-pass filter retains a sampled value of the first signal for use outside the apparatus.

10. The invention of claim 9, wherein:

the switch comprises one or more MOS devices;

each low-pass filter is an RC circuit;

the sample clock generator comprises an inverter and an AND gate;

the inverter inverts the second signal; and the AND gate (1) receives the inverted second signal from the inverter and the second signal and (2) outputs the sampling clock signal.

11. The invention of claim 9, wherein the first and second ports are pins of a single integrated circuit.

12. A method for reducing time-dependent noise coupled into a first signal at a first node from a second signal at a second node, comprising:

generating a sampling clock signal based on the second signal; and sampling the first signal based on the sampling clock signal to generate a filtered version of the first signal from the sampled first signal, wherein the sampling clock signal causes the first signal to be sampled at times when the time-dependent noise is relatively low.

13. The invention of claim 12, wherein the first signal is sampled based on occurrences of pulses in the sampling clock signal.

14. The invention of claim 13, wherein:

the second signal is a clock synchronous signal; and transitions in the second signal are converted into the pulses in the sampling clock signal.

15. The invention of claim 14, wherein the second signal is an aperiodic signal.

16. The invention of claim 12, wherein:

the sampling clock signal causes a switch to open and close; and the first signal is sampled when the switch is closed.

17. The invention of claim 16, wherein:

the first signal is low-pass filtered before it is applied to the switch; and the first signal is low-pass filtered after it passes through the switch when the switch is closed.

18. The invention of claim 17, wherein a sampled value of the first signal is retained.

19. The invention of claim 12, wherein the first and second ports are pins of a single integrated circuit.

20. The invention of claim 12, wherein:

the first signal is sampled based on occurrences of pulses in the sampling clock signal;

the second signal is a clock synchronous signal;

transitions in the second signal are converted into the pulses in the sampling clock signal;

the sampling clock signal causes a switch to open and close;

the first signal is sampled when the switch is closed;

the first signal is low-pass filtered before it is applied to the switch;

the first signal is low-pass filtered after it passes through the switch when the switch is closed; and a sampled value of the first signal is retained.

21. The invention of claim 20, wherein the first and second ports are pins of a single integrated circuit.

* * * * *